United States Patent [19]
Walker

[11] Patent Number: 6,154,158
[45] Date of Patent: Nov. 28, 2000

[54] DIGITAL-TO-ANALOG CONVERTER D.C. OFFSET CORRECTION COMPARING CONVERTER INPUT AND OUTPUT SIGNALS

[75] Inventor: Brett Christopher Walker, San Diego, Calif.

[73] Assignee: Qualcomm Incorporated, San Diego, Calif.

[21] Appl. No.: 09/107,054

[22] Filed: Jun. 30, 1998

[51] Int. Cl.$^7$ ........................................... H03M 1/10
[52] U.S. Cl. ............................................ 341/118
[58] Field of Search ............................... 341/118

[56] References Cited

U.S. PATENT DOCUMENTS 5,731,772  3/1998  Mikkola et al. ..................... 341/118

FOREIGN PATENT DOCUMENTS 0655841  5/1995  European Pat. Off. ......... H03M 1/06

OTHER PUBLICATIONS

Patent Abstracts of Japan, vol. 010, No. 001(E–371), Jan. 7, 1986 & JP 60 165831 A (Sharp KK), Aug. 29, 1985 Abstract.

*Primary Examiner*—Howard L. Williams
*Attorney, Agent, or Firm*—Philip Wadsworth; Thomas R. Rouse; Thomas Streeter

[57] ABSTRACT

A method and apparatus for adaptively correcting D.C. offset errors imposed upon signals in a communication device. The present invention includes a feedback loop correction circuit and method for measuring and reducing D.C. offset errors imposed upon analog transmission signals by transmit digital-to-analog converters (DACs) and associated analog reconstruction filters. A digital feedback loop is used to remove the D.C. offset errors from the analog transmission signals prior to transmission. In the preferred embodiment, the digital feedback loop includes a pair of analog-to-digital converters, a digital D.C. offset correction circuit, and a pair of adders. The transmission signals are digitized, filtered, and digitally processed by the correction circuit to generate offset correction signals that are equal to the undesired D.C. offset error present in the transmission signals. The correction signals are added to the digital input baseband signals thereby removing the undesirable D.C. offset errors from the transmission signals. In one preferred embodiment, the analog-to-digital converters comprise differential comparators that generate digital signals representative of the signs of the analog transmission signals. The digital D.C. offset correction circuit processes the digital signals output by the differential comparators using a selected digital signal processing technique. In one embodiment, the offset correction circuit uses a "sign bit" digital signal processing technique whereby the sign bits generated by the differential comparators are continuously integrated. The preferred embodiment of the present invention uses an MSB technique whereby sign characteristics of both the digital baseband signals and associated transmission signals are analyzed to produce the feedback correction signals. In accordance with this technique, integrators are disposed to measure zero crossing time delays between the baseband signals and the filtered signals. The zero crossing time delays are measured by analyzing the relative signs of the baseband signals and the filtered signals. The zero crossing time delays are used in the preferred embodiment as an estimate of the D.C. offset errors present in the transmission signals.

6 Claims, 12 Drawing Sheets

DIGITAL-TO-ANALOG CONVERTER D.C. OFFSET CORRECTION COMPARING CONVERTER INPUT AND OUTPUT SIGNALS

BACKGROUND OF THE INVENTION

I. Field of the Invention

This invention relates to digital-to-analog converters, and more particularly to D.C. offset error correction in digital-to-analog converters.

II. Description of the Related Art

Digital-to-analog converters, commonly referred to as "DACs" or "D-to-A" converters, are used to translate information from the digital domain to the analog domain. DACs typically transform digital signals into a range of analog values. DACs represent a limited number of different digital input codes by a corresponding number of discrete analog output values. Examples of input code formats accommodated by existing DACs include simple binary, two's complement binary, and binary-coded decimal. A number of techniques for implementing digital-to-analog converters are well known in the art.

Digital-to-analog converters are used in a wide variety of applications including digital wireless communications. For example, DACs are used in digital wireless cellular telephones to convert digital voice signals to "baseband" analog signals (i.e., signals having frequencies near D.C.). FIGS. 1a and 1b show a block diagram of an exemplary digital wireless cellular telephone 900 that utilizes DACs to convert digitally encoded voice signals into filtered baseband analog signals. The cellular telephone 900 is manufactured in accordance with the TIA specification entitled "Mobile Station-Base Station Compatibility Standard for Dual-Mode Wideband Spread Spectrum Cellular System," TIA/EIA/IS-95-A, published in May 1995 by the Telecommunications Industry Association, and referred to hereafter as the "IS-95 specification."

As shown in FIGS. 1a and 1b, the exemplary digital cellular telephone 900 primarily comprises a user interface section 916, a mobile station modem (MSM) application specific integrated circuit (ASIC) 914, a baseband analog ASIC 912, receive and transmit amplifiers 902 and 904 respectively, an upconverter 918, a power amplifier and driver 920, an antenna 906, a duplexor 908 and a low-noise amplifier (LNA) and mixer circuit 910. The cellular telephone 900 and its component parts are described in more detail in a related commonly assigned U.S. Pat. No. 5,880,631, issued on Mar. 9, 1999, entitled "High Dynamic Range Variable Gain Amplifier," which is hereby incorporated by reference. An understanding of the function and operation of many of the components of the cellular telephone 900 are not essential to understanding the present invention and therefore are not described herein. However, a brief description of the MSM 914 and baseband analog ASIC 912 is useful in understanding one exemplary application and operating environment for the present invention.

The MSM 914 performs a variety of functions for the cellular telephone 900 including voice coding, decoding, interleaving, data modulation, spreading and filtering. For example, when information is transmitted from the telephone 900 to a CDMA base station ("reverse link" transmissions), voice information is first coded by the vocoder 950 and transferred to the modulator interleaver circuit 952 where the data is encoded, interleaved, modulated, spread and filtered. The digitized and modulated data is supplied to a pair of DACs 954, 956 in the baseband analog ASIC 912 (FIG. 1b) for further processing. The MSM 914 provides a baseband modulated digital representation of the CDMA waveform to the DACs 954 and 956 in the baseband analog ASIC 912. The frequency range of the baseband digital signals is between D.C. (or 0 Hz) and approximately 630 kHz. The baseband analog ASIC 912 (largely due to the operation of the DACs 954, 956) converts the modulated digital data received from the MSM 914 into baseband analog signals. The baseband analog ASIC 912 filters the baseband analog signals generated by the DACs 954, 956 and "upconverts" the filtered signals to an analog intermediate frequency (IF) signal. The IF signal is supplied to the transmit automatic gain control (AGC) amplifier 904 and further processed for eventual transmission to a wireless base station.

A better understanding of the operation of the DACs 954, 956 can be obtained by describing the transmit section of the baseband analog ASIC 912 in more detail. One embodiment of the transmit section 100 of the baseband analog ASIC 912 of FIG. 1b is shown in FIG. 2. As shown in FIG. 2, the transmit section primarily comprises a pair of transmit DACs 102 (one each for the in-phase modulated baseband digital signals (a) and the quadrature-phase modulated baseband digital signals (Q)), a pair of CDMA filters 104, 106, and a transmit up-converter circuit 108. The well known quadrature modulation scheme preferably is used to up-convert to the IF frequency in the CDMA path of the transmit section 100 shown in FIG. 2. Therefore, two DACs are needed to perform the digital-to-analog conversion of the baseband digital signals received from the MSM ASIC 914. The IDAC 110 converts the received baseband digital in-phase signals to baseband analog in-phase signals. Similarly, the QDAC 112 converts the received baseband digital quadrature-phase signals to baseband analog quadrature-phase signals. In the embodiment shown in FIG. 2, the transmit DACs 102 have differential outputs to reduce the detrimental effects caused by external noise that may be generated elsewhere on the baseband analog ASIC 912.

The I and Q channel CDMA filters 104, 106 remove unwanted noise that is generated by the DACs 110 and 112, respectively. The CDMA filters 104, 106 comprise anti-alias filters which perform a smoothing function on the baseband analog signals generated by the transmit DACs 102 and thereby remove any high frequency components introduced by the DACs 102. Similar to the transmit DACs 102, the CDMA filters 104, 106 have differential outputs as shown in FIG. 2. The outputs of the CDMA filters 104, 106 are input to the transmit up-converter 108 which converts the baseband analog signals to an IF frequency for further processing and eventual transmission to a CDMA base station.

Disadvantageously, the transmit section 100 shown in FIG. 2 introduces errors which are manifest as added D.C. offsets (referred to hereafter as "offset induced errors") in the transmit signals of interest before the signals are output to the remainder of the cellular telephone circuitry. In particular, and referring again to FIG. 2, the offset induced errors can be imposed upon the transmit signals by the transmit DACs 102 and by active components in the CDMA filters 104 and 106. Because the CDMA filters 104 and 106 can be relatively complex the induced offset errors can be significant. Disadvantageously, the offset errors introduced into the signal path, and specifically into the input of the mixers 114, 116, can cause a carrier signal to appear in the IF signal generated at the output of the transmit up-converter circuit 108. To meet certain carrier suppression specifications it is necessary to reduce or eliminate the offset induced errors introduced by the transmit section 100. Unfortunately, the offset induced errors have proven difficult to eliminate in the past. Because the magnitude of the offsets vary widely depending upon the operational characteristics (i.e., voltage, temperature, etc.) of the baseband analog ASIC 912 the errors have proven difficult to eliminate. Therefore, a need exists for a method and apparatus which can reduce or eliminate the D.C. offset errors that appear at the input of the transmit mixers 114, 116.

A prior art approach at reducing the D.C. offsets is shown in FIG. 3. The prior art uses a fuse-based D.C. offset error correction circuit 120 to reduce the errors produced at the output of the CDMA filters 104, 106. The error correction circuit 120 primarily comprises a series of fuses and a relatively small DAC which is capable of adding an error adjustment to the signals at the input of the mixers 114, 116. The error correction circuit allows designers to measure the D.C. offset at the output of the filters under selected nominal conditions. Using well known fuse trimming techniques, fuses in the correction circuit 120 are blown until the errors are reduced to zero under the selected nominal conditions. Disadvantageously, this technique provides a static error correction solution. Once the fuses are blown, the errors can not be corrected under the varying operational conditions of the ASIC 912. For example, as the voltage and temperature of the ASIC 912 varies over time, D.C. offsets would be introduced despite the static settings of the correction circuit 120. Devices that were once usable under the nominal conditions at which the fuses were blown become unusable under some operating environments, thus adversely affecting the yield characteristics of the baseband analog ASIC 912.

Further, the prior art approach shown in FIG. 3 disadvantageously introduces an additional manufacturing and testing step into the fabrication of the ASIC 912. Using the prior art approach of FIG. 3, the manufacturer of the ASIC 912 must measure the offset errors, trim fuses to eliminate the offset errors, and test the results to ensure the fuses are trimmed properly. This process adds additional time to the fabrication of the ASIC 912 and consequently adds to the manufacturing cost of the ASIC. Therefore, an improved D.C. offset error correction method and apparatus is needed which does not require the use of fuses or fuse trimming technique. Further, an improved error correction method and apparatus is needed which dynamically monitors and corrects the errors introduced by the transmit section 100 under all operating conditions under which the ASIC 912 must operate.

Another technique for reducing D.C. offset errors is shown in FIG. 4. As shown in FIG. 4, an analog feedback loop correction circuit 122 is used to measure and suppress the D.C. offset errors produced at the output of the CDMA filters 104 and 106. The analog feedback loop 122 includes analog filters that distinguish the D.C. offset errors from the analog signals of interest. The feedback loop also includes integrators disposed to integrate the D.C. offset errors across integrating capacitors. By selecting the gains of the integrators appropriately, the integrators generate D.C. cancellation signals that are nominally equal to the undesired D.C. errors introduced into the signal path by the CDMA filters and the transmit DACs 102. The D.C. cancellation signals are added to the analog signals generated by the transmit DACs 102 thereby eliminating undesired D.C. feed-through. A more detailed description of this prior art approach (in the context of a received RF signal path) is given with reference to FIGS. 9 and 10 of U.S. Pat. No. 5,617,060, issued on Apr. 1, 1997 to Wilson et al. and assigned to the owner of the present invention, which is hereby incorporated by reference.

Disadvantageously, the analog feedback loop has proven very difficult to implement in an ASIC device. The analog signals of interest generated at the output of the CDMA filters 104, 106 have levels which are very close to D.C.. Therefore, the corner frequency of the filters used to differentiate the D.C. offset errors from the signals of interest must be very low. Because the corner frequency ($w_{pole}$) is proportional to the transconductance ($g_m$) divided by the capacitance (C), the transconductance $g_m$ must be constrained to be very small or, alternatively, the value of C must be made to be relatively large. Unfortunately, the value of $g_m$ is very difficult to control and there is a limit to how small the transconductance can be made. In addition, physical and cost constraints limit how large the value of C can be made in an integrated circuit environment (large capacitors occupy large areas of an integrated circuit and therefore increase the costs of the integrated circuit). One possible solution is to implement C using a component disposed outside of the integrated circuit, however this approach creates undesirable circuit board current leakages. Therefore, it is desirable to provide a D.C. correction method and apparatus which is easily implemented in an integrated circuit, which does not require the use of fuse trimming, and which can dynamically and flexibly monitor and correct D.C. offsets as they are introduced. The present invention provides such a D.C. correction method and apparatus.

SUMMARY OF THE INVENTION

The present invention is a novel method and apparatus for adaptively correcting D.C. offset errors imposed upon communication signals in a communication device. The present invention includes a feedback loop correction circuit and method for measuring and suppressing D.C. offset errors imposed upon radio frequency analog transmission signals by transmit digital-to-analog converters (DACs) and associated analog reconstruction filters. In accordance with the present invention, a negative digital feedback loop is used to remove the D.C. offset errors from the analog transmission signals prior to transmission. In the preferred embodiment, the digital feedback loop includes a pair of analog-to-digital converters (one each for the in-phase (I) and quadrature-phase (Q) channels), a digital D.C. offset correction circuit, and a pair of adders. Each analog-to-digital converter is disposed at the output of an associated reconstruction filter. The analog transmission signals are digitized, filtered, and digitally processed by the correction circuit to generate offset correction signals for both the I and Q channels. The offset correction signals are nominally equal to the undesired D.C. offset errors introduced into the signal path by the transmit DACs and the reconstruction filters. The offset correction signals are added to the input digital baseband signals prior to digital-to-analog conversion thereby removing the undesirable D.C. offset errors from the transmission signals.

In one preferred embodiment, the analog-to-digital converters comprise 1-bit differential comparators that generate digital signals representative of the signs of the analog transmission signals output by the reconstruction filters. The digital D.C. offset correction apparatus processes the digital signals output by the differential comparators using a selected digital signal processing technique. In one embodiment, the offset correction circuit uses a "sign bit" digital signal processing technique whereby the sign bits generated by the differential comparators are continuously integrated. In this embodiment, the offset correction circuit comprises an I-channel integrator and a Q-channel integrator disposed to integrate the signs of the analog transmission signals. In one embodiment, the integrators comprise binary up/down counters. The sign of the analog transmission signals control the direction (increment or decrement) of the counters. After counting for a predetermined time interval, the counters contain negative values (due to the negative feedback loop) the absolute value of which are nominally equal to the D.C. offset errors imposed on the transmission signals. The counter values are continuously added to the digital baseband signals to compensate for the D.C. offset errors.

The preferred embodiment of the present invention uses sign characteristics of both the digital baseband signals and associated transmission signals output by the reconstruction filters to produce the feedback offset correction signals. The preferred technique forces the transmission signals output by the reconstruction filters to have very similar statistical characteristics as the digital baseband signals. In accordance with this technique, integrators are disposed to measure the rising edge time delay defined as the time delay between the rising edge of the baseband signal and the rising edge of its associated filtered signal. Similarly, the falling edge time delay defined as the time delay between the falling edge of the baseband signal and the falling edge of its associated filtered signal is also measured. These "zero crossing" time delays are measured by analyzing the relative signs of the digital input signals and the filtered signals. The sign of the digital input signal is obtained from the most significant bit (MSB) of the baseband signal. The sign of the filtered signal is obtained from the output of the analog-to-digital converter, which, in the preferred embodiment comprises a 1-bit differential comparator. Counters are used to count for a period of time approximating the zero crossing time delays. The zero crossing time delays are used by the present invention to estimate the D.C. offset errors present in the transmission signals.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Throughout this description, the preferred embodiment and examples shown should be considered as exemplars, rather than as limitations on the present invention.

Figure 2:
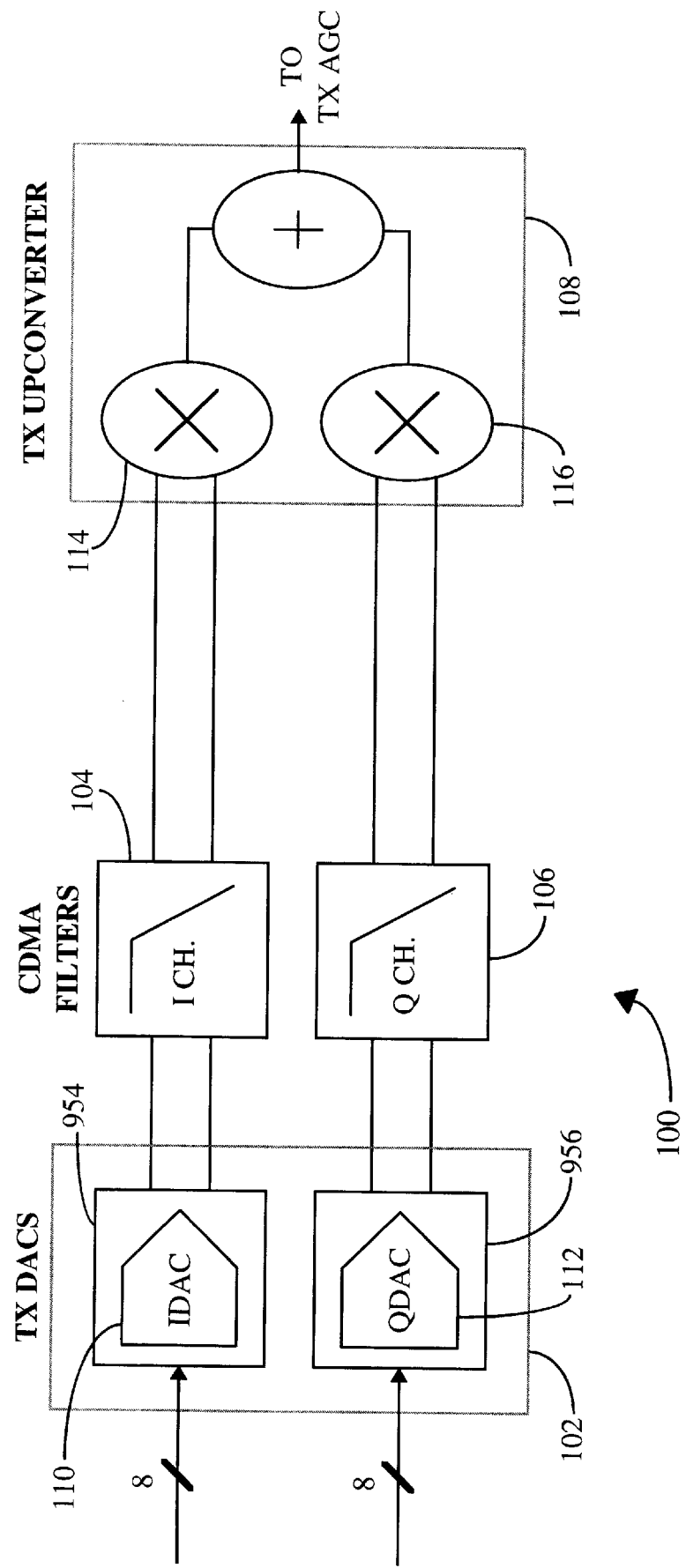
FIG. 2 is a block diagram of the transmit section of the baseband analog ASIC shown in FIG. 1b.
Figure 3:
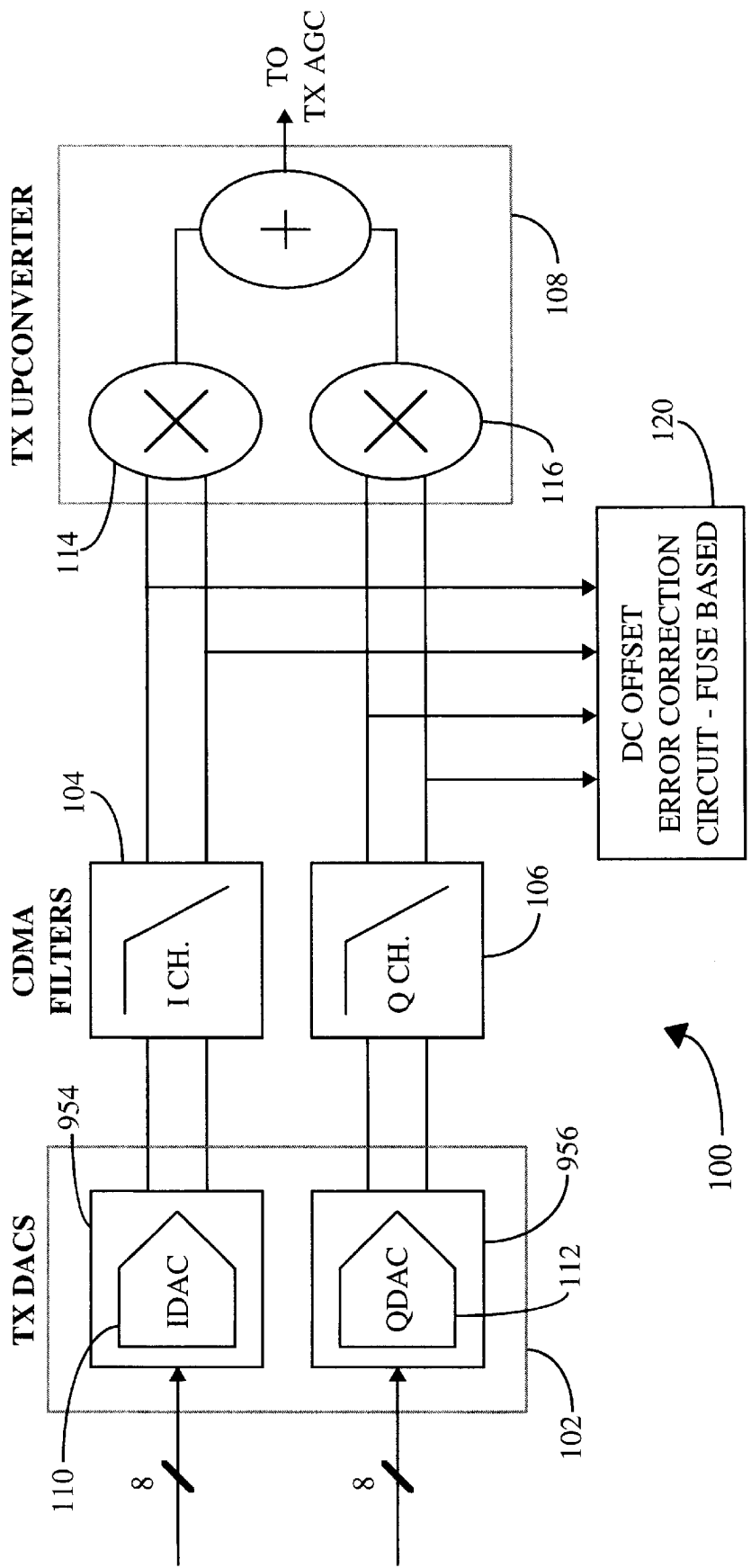
FIG. 3 shows a prior art approach for reducing the offset induced errors produced at the output of the CDMA filters of FIG. 2 using a "fuse-based" D.C. offset error correction circuit.
Figure 4:
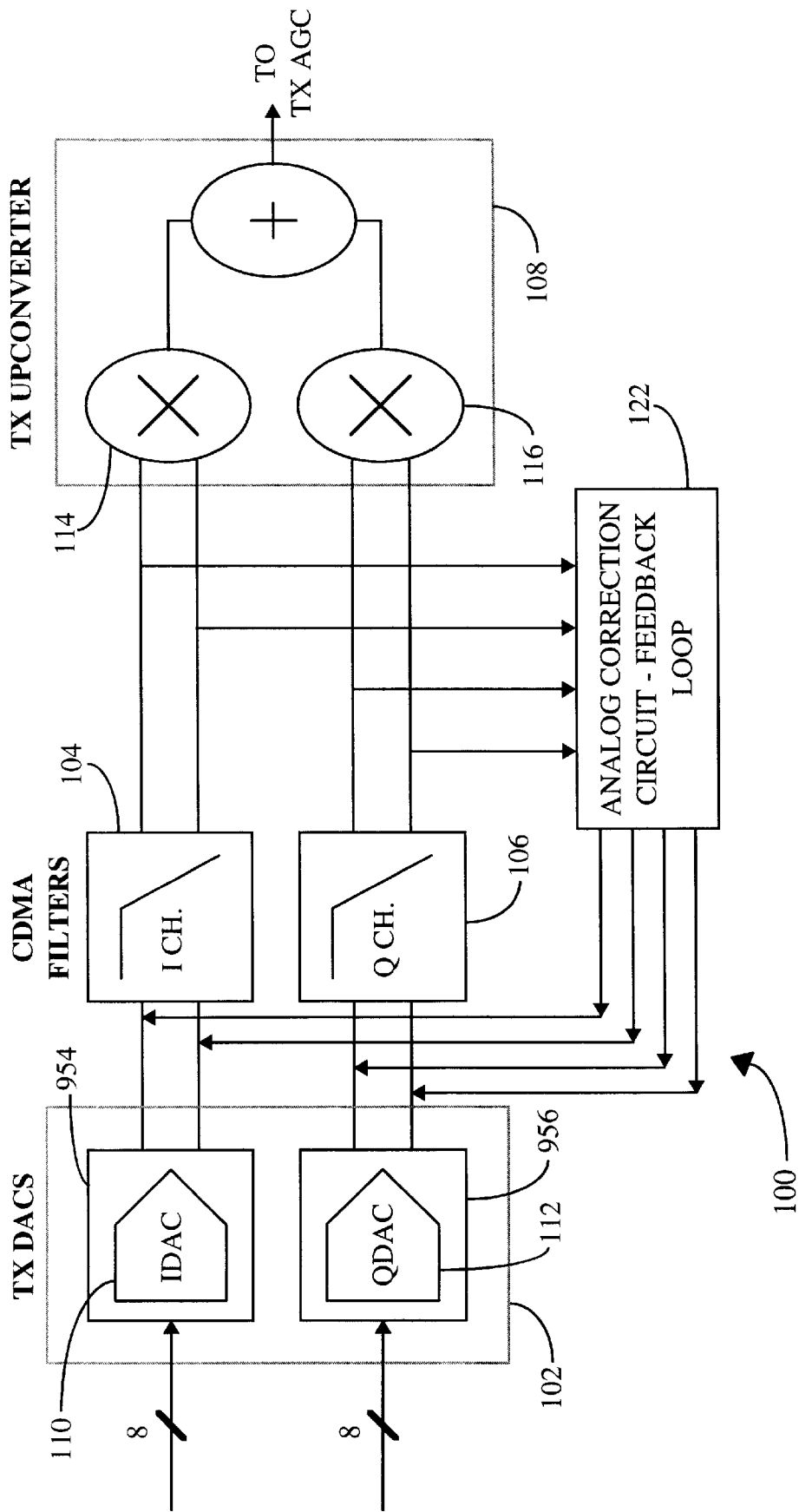
FIG. 4 shows another prior art approach for reducing the offset induced errors produced at the output of the CDMA filters of FIG. 2 using an analog D.C. offset error correction circuit.
Figure 5:
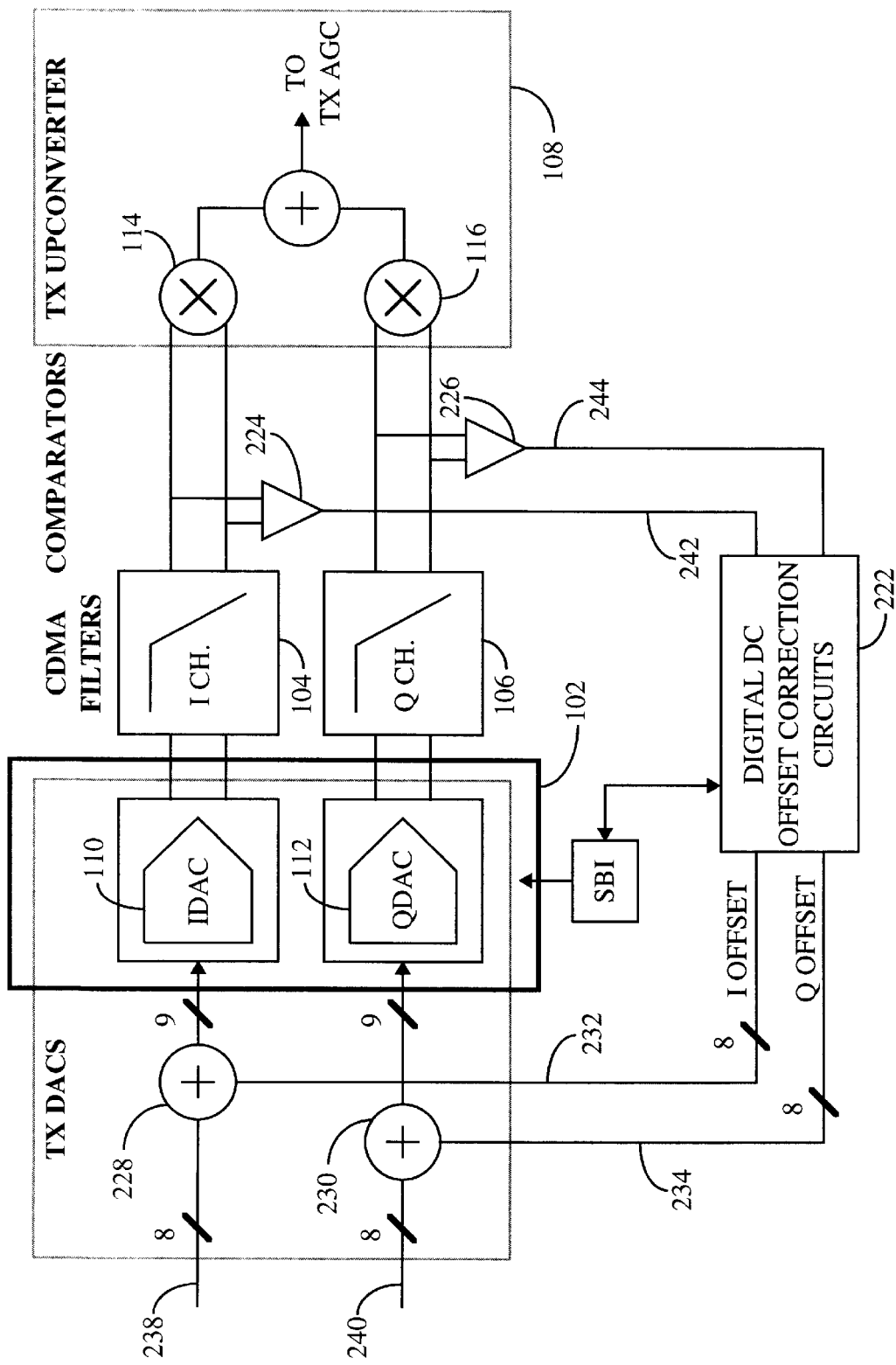
FIG. 5 shows a block diagram of the preferred embodiment of the present invention including a digital D.C. offset error correction circuit.

A block diagram of the preferred embodiment of the present invention is shown in FIG. 5. As shown in FIG. 5, the present invention includes the transmit DACs 102, the CDMA filters 104 and 106, and the transmit up-converter 108. The transmit DACs 102, the CDMA filters 104, 106, and the transmit up-converter 108 all function as described above with reference to FIGS. 2–4. As shown in FIG. 5, a digital feedback loop D.C. offset correction circuit 222 has been exchanged for the prior art analog feedback loop correction circuit 122 described above with reference to FIG. 4. The correction circuit 222 includes inputs that are operatively connected to the outputs of a pair of I and Q analog-to-digital-converters, 224, 226, respectively, via signal lines 242, 244, respectively, as shown in FIG. 5. The outputs of the correction circuit 222 are connected to a first input of a pair of I and Q channel adders 228, 230, respectively, as shown in FIG. 5.

As described above with reference to FIGS. 2–4, the CDMA filters 104, 106 smooth the transmit signals that are output by the transmit DACs 102 and thereby remove undesirable high frequency components and quantization noise from the transmit signals introduced by the transmit DACs 102. One embodiment of the present invention uses the well-known quadrature modulation scheme for transmitting signals up to the intermediate frequency (IF). Offset induced errors are created by the operation of the transmit DACs 102 and by active components in the CDMA filters 104 and 106. The D.C. offset errors present at the input of the mixers 114, 116, can lead to carrier signal appearing in the IF signal generated at the output of the transmit up-converter circuit 108. The preferred embodiment of the present invention shown in FIG. 5 uses a novel technique to reduce the offset-induced errors present at the input of the mixers 114, 116. The D.C. offset correction circuit 222 removes or reduces the offset induced errors in order to conform to certain carrier suppression criteria. The operation and functions of the digital feedback loop DC offset correction circuit 222 and its related circuitry is now described in more detail.

The analog transmit signals output by the CDMA filters 104, 106 are digitized by the analog-to-digital converters 224, 226, respectively, and are provided as digital inputs to the correction circuit 222 via signal lines 242, 244, respectively. In the preferred embodiment, the analog-to-digital converters 224, 226 comprise 1-bit differential comparators. Although alternative implementations of the converters 224, 226 may be used to practice the present invention, and are within the scope of the present invention, the 1-bit differential comparators are preferred because they are very simple to implement and because they introduce very small D.C. offsets into the error correction loop. The 1-bit comparators adequately represent the dynamics of the CDMA signals output by the CDMA filters 104, 106. CDMA signals essentially are symmetrical in nature (essentially they are filtered binary waveforms) and therefore they are good candidates for use with 1-bit comparators. Consequentially, due to the inherent characteristics of CDMA signals very little quantization noise is introduced at low frequencies by the comparators 224, 226. Therefore, the comparators 224, 226 produce sufficient information about the transmission signals to enable the D.C. feedback loop to measure and correct the D.C. offset errors present in the transmission signals.

The outputs of the comparators 224, 226 comprise digital representations of the signs of the transmit signals. For example, the comparator 224 generates a logical one if the filtered I transmit signal (filtered by the I-channel CDMA filter 104) is positive (i.e., has a positive sign), and it generates a logical zero if the filtered I transmit signal is negative. Once converted into the digital domain, the digital D.C. correction circuit 222 can utilize a variety of digital techniques to process the signals. Two exemplary techniques are described in more detail below with reference to FIGS. 6 and 8, however, those skilled in the digital signal processing art will appreciate that several alternative digital processing means can be utilized. For example, the correction circuit may alternatively use finite impulse response (FIR) filters, infinite impulse response (IIR) filters, or adaptive filters using a least mean squared algorithm.

The correction circuit 222 processes the signals input via the signal lines 242, 244 using one of the digital processing techniques of the present invention, and generates offset correction signals for both the in-phase (I) and quadrature-phase (Q) channels. The I and Q offset correction signals are provided to first inputs of a pair of eight-bit adders 228, 230 over signal lines 232, 234, respectively. The offset correction signals are added to the digital I and Q channel baseband signals before being converted by the transmit DACs 110, 112. In the embodiment shown in FIG. 5 the transmit DACs 102 comprise 9-bit digital-to-analog converters. In this embodiment the range of the transmit DACs 102 have been extended by one bit as compared to range of the transmit DACs 102 of the prior art (and described above with reference to FIG. 4). This 1-bit range extension is necessary in some cases and will depend upon the characteristics of the signals. A 1-bit extension is necessary to allow for both an 8-bit baseband signal and an 8-bit correction signal as shown in FIG. 5. However, in alternative embodiments, the transmit DACs 102 may comprise 8-bit digital-to-analog converters, particularly when the baseband signal comprises a 7-bit or 7.5-bit signal.

As shown in FIG. 5, the I-channel offset correction signal is added to the I-channel digital baseband signal by the I-adder 228. The nine-bit output of the I-adder 228 is provided as input to the 9-bit IDAC 110. Similarly, the Q offset correction signal is added to the Q-channel digital baseband signal by the Q-adder 230. The nine-bit output of the Q-adder 230 is provided as input to the QDAC 112. Thus, the baseband signals appearing on the input lines 238 (I input) and 240 (Q input) essentially are shifted by the offset correction signals appearing on the signal lines 232 (I Offset) and 234 (Q Offset), respectively, in order to counteract the effects of the D.C. offset errors introduced by the I-channel CDMA filter 104 and the Q-channel CDMA filter 106, respectively.

The present invention advantageously uses the same DACs 110, 112 both for analog/digital conversion and for offset error correction purposes. This DAC "re-use" advantageously reduces the amount of circuitry associated with offset error correction. Thus, using the method and apparatus of the present invention, offset error correction is performed at a reduced cost and complexity as compared with other approaches that utilize DACs dedicated for offset error correction. In addition, because both the signal conversion and offset error correction processes utilize identical DACs, the present invention advantageously exhibits none of the problems associated with DAC mismatches. Two exemplary techniques used to implement the digital correction circuit 222 are now described in more detail with reference to FIGS. 6–8.

Figure 6:
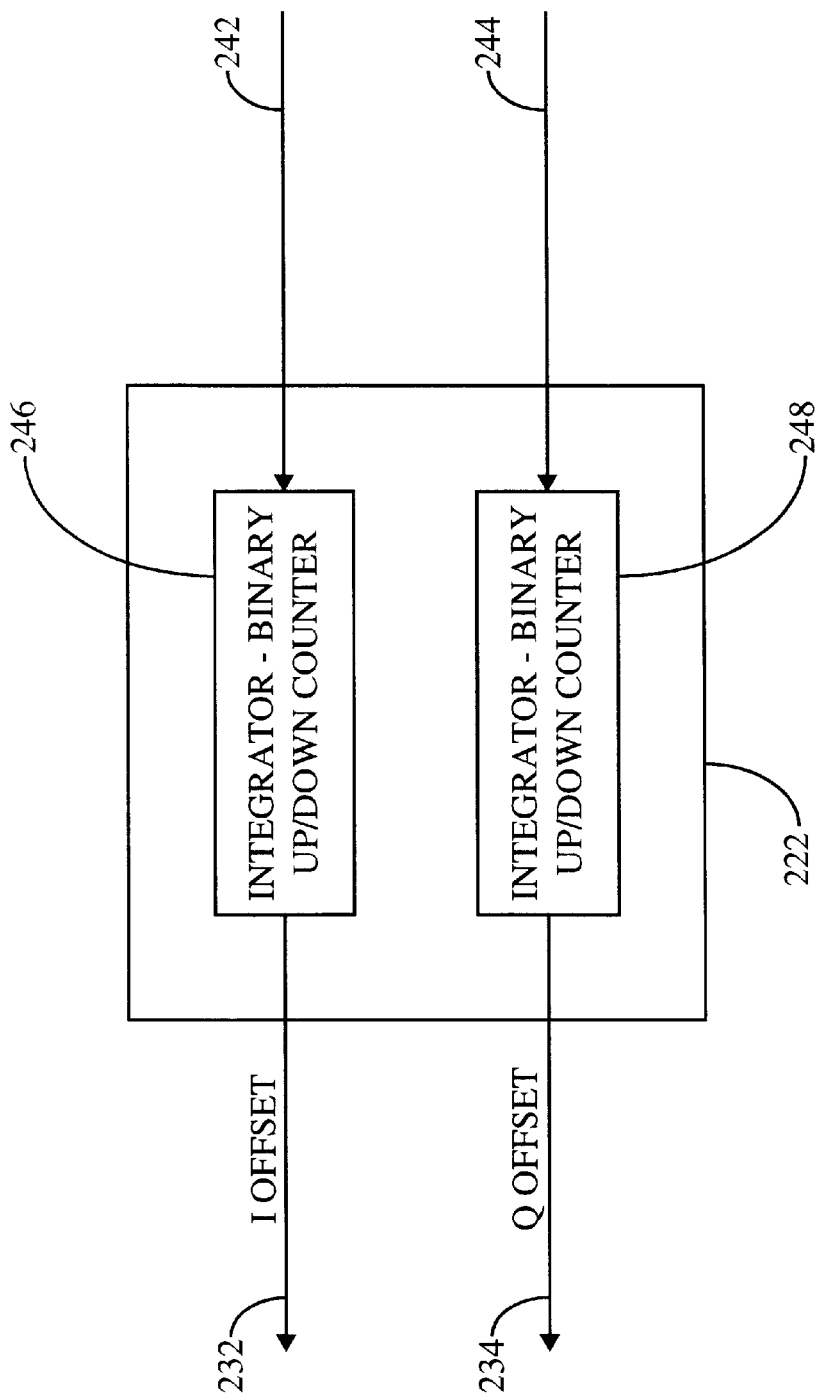
FIG. 6 shows a simplified block diagram of an alternative embodiment of the present invention whereby offset correction signals are generated using a sign bit digital signal processing technique.

Sign Bit Digital Signal Processing Technique for Generating Offset Correction Signals FIG. 6 shows a simplified block diagram of an alternative embodiment of the present invention whereby the offset correction signals I Offset and Q Offset described above with reference to FIG. 5 are generated using a "sign bit" digital signal processing technique. In the alternative embodiment shown, the DC Offset Correction Circuit 222 of FIG. 5 comprises a pair of integrators 246, 248. The integrators 246, 248 continuously integrate the digital representations of the signs of the transmit signals.

More specifically, and referring concurrently to FIGS. 5 and 6, the integrator 246 integrates the digitized sign of the I-channel transmit signals generated by the 1-channel CDMA filter 104. Similarly, the integrator 248 integrates the digitized sign of the Q-channel transmit signals generated by the Q-channel CDMA filter 106. As described above with reference to FIG. 5, because the filtered transmit signals (both I and Q channels) output by the CDMA filters 104, 106 are CDMA signals, they should be substantially symmetrical about D.C. Therefore, the digitized sign signals output by the 1-bit comparators 224, 226 (FIG. 5) should comprise an equal number of logical ones as logical zeros. That is, in the absence of any offset-induced errors, the comparators should output the same number of ones as zeros due to the symmetrical nature of the CDMA signals. However, as described above, offset-induced errors are present in the transmit signals and therefore the comparators 224, 226 generate a slightly biased output (i.e., they output slightly more zeros than ones, or vice versa, depending upon the sign of the D.C. shift). The integrators 246, 248 detect this bias, and compensate for it by subtracting (i.e., adding the negative of the D.C. offset error) the offset from the digital baseband signals before they are converted to analog signals.

In one embodiment, the integrators 246, 248 comprise binary up/down counters. The logical values input on the signal lines 242, 244 dictate the count direction. For example, in one embodiment, if the digitized output of the comparator 224 represents a negative I-transmit signal (i.e., comparator 224 outputs a logical "0"), then a 0 will be input to the counter 246 via the signal line 242, and the counter 246 will thereby be instructed to count up on a next clock cycle. In contrast, if the digitized output of the comparator 224 represents a positive I-transmit signal and a logical 1 is thereby input to the counter 246, the counter 246 will count down on the next clock cycle. Any convenient clock can be used to clock the counters 246, 248. However, because the performance of the feedback loop is somewhat dependent upon the rate of the clock signals used to clock the counters 246, 248, the selected clock should have a frequency sufficient to meet system requirements. In one embodiment, the counters are clocked using the I clock (ICLK) and Q clock (QCLK) clock signals that are used to clock the baseband signals. Alternatively, any clock signal that is not synchronized to the transmission signals may be used. In addition, multiples of the ICLK or QCLK clock signals may be used by dividing down or multiplying up the clock signals.

If positive offset-induced errors are present in the transmit signals, the comparators 224, 226 will yield more positive sign values (i.e., more ones) than negative sign values. The counters count down when they receive a logical one, and count up when they receive a logical zero. Consequently, the integrators 246, 248 will count down more often than they count up if positive offset errors are present in the transmit signals. The counters therefore will contain negative values representative of the D.C. offset. These negative values are added to the baseband signals to compensate for the positive D.C. offset. A positive offset thereby causes the counter outputs to decrease (i.e., the counters are decremented), while a negative offset causes the counter outputs to increase (i.e., the counters are incremented). Therefore, when positive offset errors are detected, less is added to the input signals before conversion into the analog domain. In contrast, when negative offset errors are detected, more is added to the input signals to compensate for the negative D.C. offset errors.

The integrator 248 functions identically to the integrator 246 and integrates the digitized Q-transmit signals. The counter outputs are provided on signal lines 232 (I Offset) and 234 (Q Offset). As described above with reference to FIG. 5, the I-channel offset correction signal (output by the integrator 246) is added to the I-channel digital baseband signal. Similarly, the Q-channel offset correction signal (output by the integrator 248) is added to the Q-channel digital baseband signal. Thus, the digital baseband signals appearing on the input lines 238 (I input) and 240 (Q input) are corrected by the outputs of their respective integrators thereby compensating for the offset-induced errors.

In one embodiment, the z-transform version of the integrators 246, 248 comprises integrators made in accordance with the following z-transform equation: $-(2^{-n})/1-z^{-1}$. Essentially the D.C. offset circuit 222 shown in FIG. 6 is a digital analogue of an analog integrator circuit. Disadvantageously, a few problems are associated with the implementation of the D.C. offset correction circuit 222 shown in FIG. 6. First, the corner frequency must be constrained to be very low. In addition, the transmit signals must be integrated over a relatively long period of time. Consequently, the counters used to implement the integrators 246, 248 must be relatively large. Because the feedback loop of FIG. 5 using the correction circuit of FIG. 6 attempts to follow the low frequency content of the input baseband signal in a non-linear manner, it will tend to distort and corrupt the CDMA signal near D.C. Therefore, an improved method and apparatus for generating D.C. offset correction signals is desirable and is described below with reference to FIGS. 7 and 8.

Figure 7:
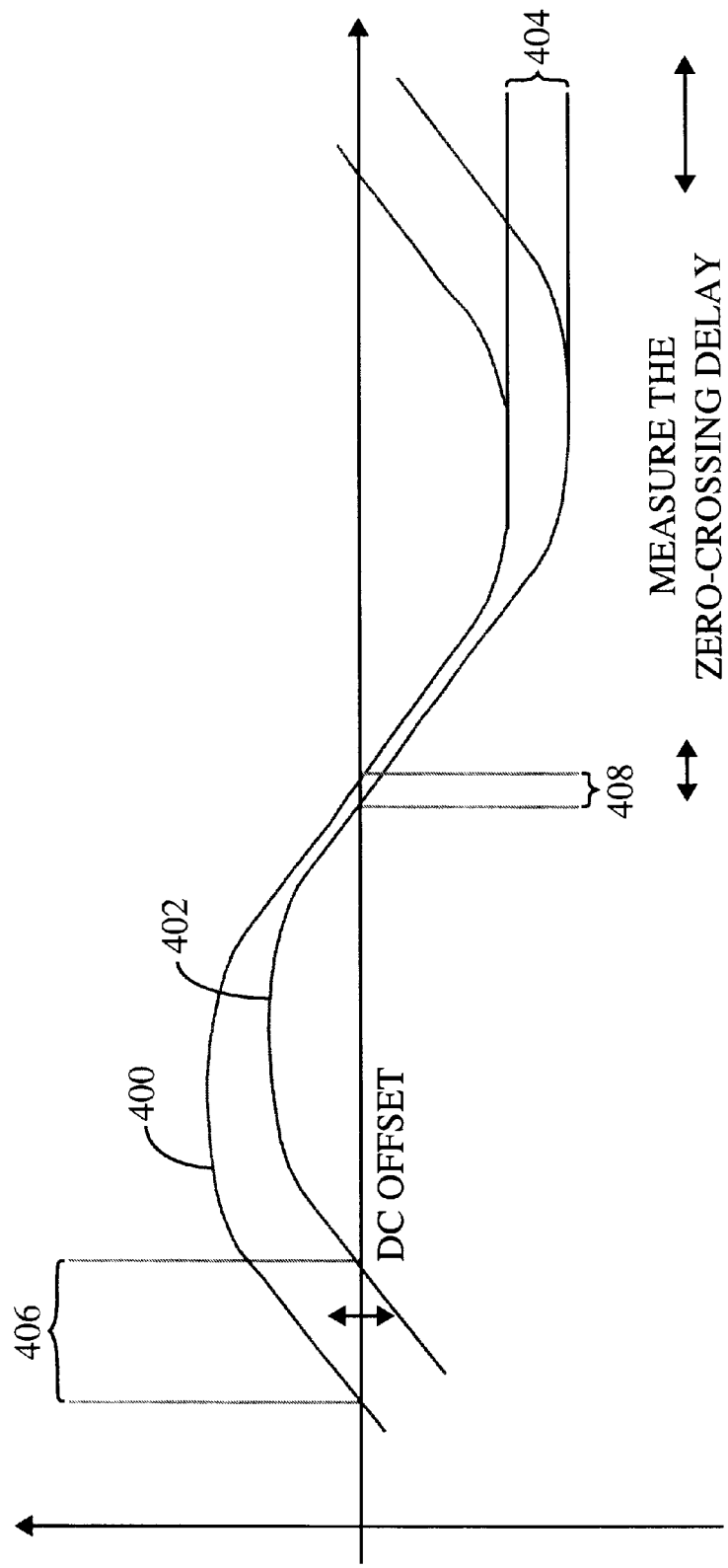
FIG. 7 shows an example of signals processed by the D.C. offset error correction circuit of FIG. 5.

MSB Digital Signal Processing Technique for Generating Offset Correction Signals—the Preferred Embodiment of the Present Invention The preferred apparatus and method for generating D.C. offset correction signals is described below with reference to FIGS. 7 and 8. In brief, the preferred technique uses sign characteristics of the baseband signals input on the signal lines 238 (I input) and 240 (Q input) (FIG. 5) and sign characteristics of the associated transmit signals output by the CDMA filters 104, 106 (and digitized by the comparators 224, 226, respectively) to produce the feedback offset correction signals. The technique forces the transmit signals provided as inputs to the mixers 114, 116 to have very similar statistical characteristics as the digital baseband signals provided as inputs to the adders 228, 230. FIG. 7 shows an example of signals processed by the D.C. correction circuit of FIG. 5. The signals shown in FIG. 7 are simplified for explanatory purposes only.

As shown in FIG. 7, an exemplary signal that is input to the transmit DACs 102 (FIG. 5) is shown as a sine wave. This signal is referred to an "original" signal 400 (i.e., the original signal is as the signal appears before being filtered by the CDMA filters 104 or 106). After being filtered by the CDMA filters (104 or 106), the original signal 400 is shifted and delayed, as shown in FIG. 7 as a filtered signal 402. The amplitude of the filtered signal 402 is shifted by a D.C. offset 404 that is introduced as described above by the CDMA filters 104, 106. The preferred embodiment of the present D.C. offset correction method and apparatus takes advantage of the observation that the D.C. offset 404 can be estimated by measuring the difference between rising edge and falling edge zero crossing time delays of the original signal 400 and the filtered signal 402. The difference between the rising edge and falling edge zero crossing time delays is proportional to the D.C. offset error 404 imposed on the original signal 400.

Therefore, by measuring the time delay between the rising edge of the original signal 400 and the filtered signal 402 (shown as a rising edge delay 406 in FIG. 7), and between the falling edge of the filtered signal 402 and the original signal 400 (shown as a falling edge delay 408 in FIG. 7), the D.C. offset error can be measured and subsequently corrected. As described below in more detail with reference to FIG. 8, the time delays 406, 408 are measured by analyzing the relative signs of the original signal 400 and the filtered signal 402 at different time instances.

For example, the rising edge zero crossing time delay 406 can be measured by starting a counter at a first time instant when the original signal 400 changes sign from negative to positive (i.e., the instant the signal 400 crosses zero on a rising edge), and subsequently terminating the counter at a second time instant when the filtered signal 402 changes sign from negative to positive (i.e., the instant the signal 402 crosses zero on a rising edge). Similarly, the falling edge zero crossing time delay 408 can be measured by starting a counter at a third time instant when the filtered signal 402 changes sign from positive to negative (i.e., the instant the signal 402 crosses zero on a falling edge), and subsequently terminating the counter at a fourth time instant when the original signal 400 changes sign from positive to a negative (i.e., the instant the signal 400 crosses zero on a falling edge). The rising edge delay 406 is shortened by a positive D.C. offset and lengthened by a negative D.C. offset (the delay 406 is lengthened in the example shown in FIG. 7). In contrast, the falling edge delay 408 is lengthened by a positive D.C. offset and shortened by a negative D.C. offset (i.e., the falling edge of the filtered signal 402 will occur after that of signal 400 as the D.C. offset is increased). The preferred correction technique measures the difference between the zero crossing time delays to determine the D.C. offset errors present in the transmit signals.

In the preferred embodiment of the present invention, the D.C. correction circuit 222 of FIG. 6 can be modified to take advantage of the observations described above with reference to FIG. 7. A simplified block diagram of the preferred embodiment of the present invention is shown in FIG. 8. As shown in FIG. 8, the correction circuit 222 of FIG. 6 has been modified to include an I-channel decision block 250 and a Q-channel decision block 252. The decision blocks 250, 252 compare the signs of the baseband signals input on the signals lines 238, 240 (FIG. 5) to the signs of the transmit signals output by the CDMA filters 104, 106, respectively. Depending upon the relative signs of the baseband and transmit signals, the decision blocks 250, 252 generate outputs to instruct the integrators 246, 248 to alternatively do nothing, count up, or count down. In one embodiment, the integrators 246, 248 comprise binary up/down counters. The decision blocks 250, 252 therefore implement the following D.C. offset correction algorithm for their respective I and Q channels:

If the baseband signal and the transmit signal have the same sign—do nothing.

If the baseband signal is positive and the transmit signal is negative—count up.

If the baseband signal is negative and the transmit signal is positive—count down.

Accordingly, in the preferred embodiment, the decision blocks 250, 252 are implemented in accordance with the following truth table:

| Baseband Signal Sign (MSB) | Transmit Signal Sign | Error Signal to Counter |
|---|---|---|
| −1 | +1 | +1 |
| +1 | +1 | 0 |
| −1 | −1 | 0 |
| +1 | −1 | −1 |

Thus, the decision blocks issue a count instruction (i.e., count up or count down) to the counters 246, 248 only during the zero crossings of their associated baseband and transmit signals. The counters 246, 248 are used in this manner to count the time delays between zero crossings of the baseband signals and the filtered transmit signals. For the most part (i.e., when both the baseband signal and the filtered transmit signal have the same sign, both positive or both negative) the decision blocks instruct the counters to do nothing (i.e., the "error signal" output by the decision block is equal to "0"). However, during zero crossings, the counters are instructed to count either up or down, depending upon the direction of the D.C. offset error.

As described above with reference to FIG. 7, the zero crossing time delays are thereby used to estimate the D.C. offset errors present in the transmit signals. If offset-induced errors are present in the transmit signals the counters will track the zero crossing time delays imposed on the transmit signals by the offset errors. Therefore, the counters contain values that are representative of the D.C. offset errors. These values are continuously added to the baseband signals to compensate for the D.C. offset present in the baseband signals. Thus, the digital baseband signals appearing on the input lines 238 (I input) and 240 (Q input) are corrected by the outputs of their respective counters, 232, 234, thereby compensating for the offset-induced errors.

The sign of a selected baseband signal at any given time instant is obtained by observing the most significant bit ("MSB") of the selected digitized baseband signal that is input to an associated adder. For example, the MSB of the I-channel baseband signal that is input to the adder 228 (FIG. 5) provides a digitized representation of the sign of the I-channel baseband signal. The MSB of the I-channel baseband signal is provided to a first input of the I-channel decision block 250 via signal line 254. Similarly, the MSB of the Q-channel baseband signal is provided to a first input of the Q-channel decision block 252 via signal line 256.

As described above with reference to FIGS. 5 and 6, the sign of a selected transmit signal is obtained from a selected comparator. For example, the sign of the I-channel transmit signal that is output by the CDMA filter 104 is obtained from the comparator 224. The comparator 224 generates a digitized representation of the sign of the I-channel transmit signal. Therefore, the sign of the I-channel transmit signal is provided to a second input of the I-channel decision block 250 via signal line 242. Similarly, the sign of the Q-channel transmit signal is provided to a second input of the Q-channel decision block 252 via signal line 244.

Figure 8:
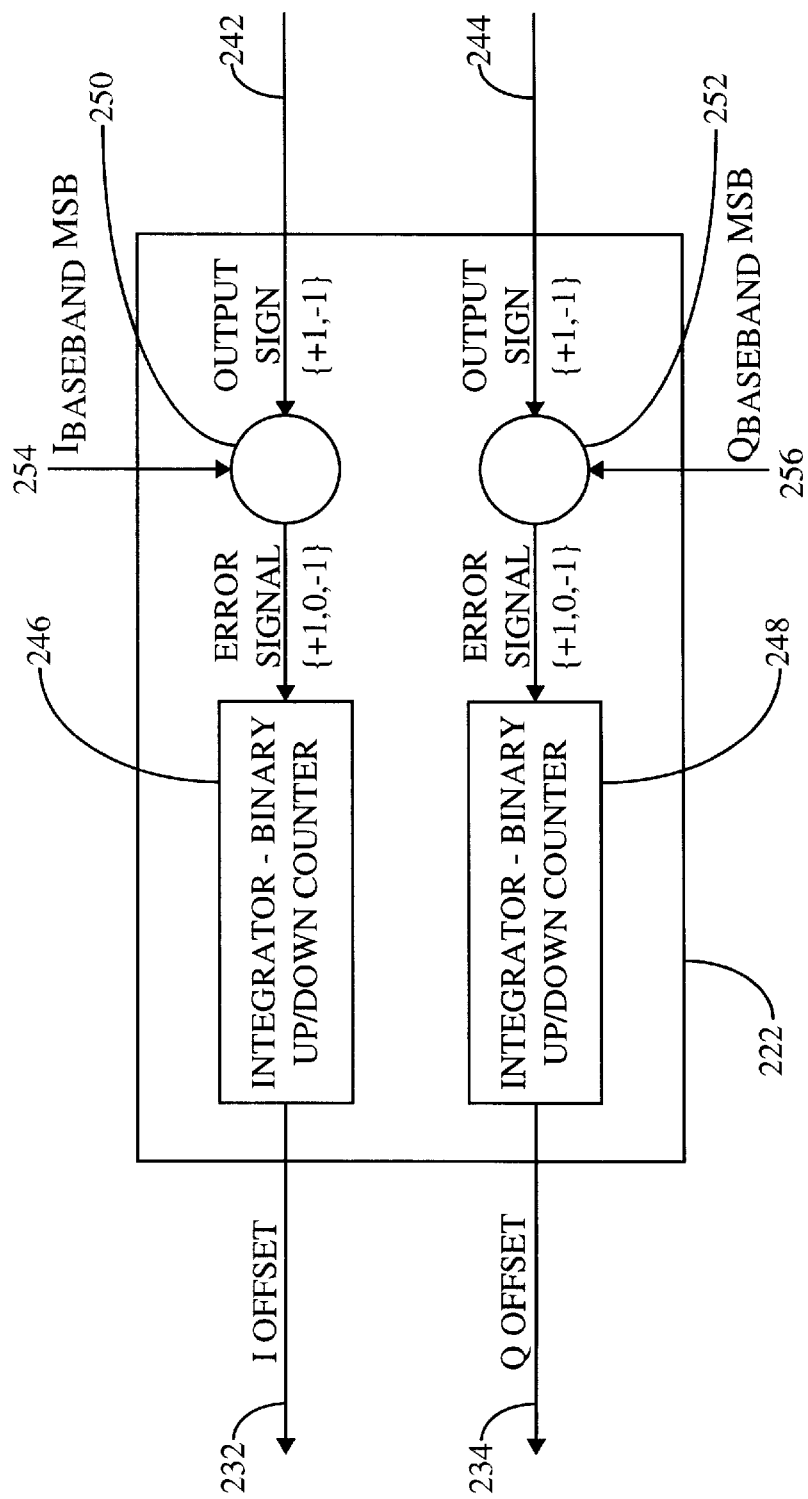
FIG. 8 shows a simplified block diagram of the preferred embodiment of the present invention whereby offset correction signals are generated using an MSB digital signal processing technique.

Beyond the inclusion of the decision blocks 250, 252, the correction circuit 222 of FIG. 8 performs similarly to the correction circuit 222 described above with reference to FIG. 6. Consequently, the same hardware can be used to implement both embodiments of the correction circuit 222. Advantageously, both embodiments can therefore be implemented in the same integrated circuit and can be operatively selected to meet the offset error correction performance requirements of the system. The correction method and apparatus shown in FIG. 8 has certain advantages over that of FIG. 6. For example, because the counters 246, 248 are inoperative most of the time (because the signs of the baseband and transmit signals are the same most of the time), the preferred apparatus of FIG. 8 requires less power than does the correction circuit of FIG. 6. Similarly, because the apparatus of FIG. 8 only counts the zero crossing time delays of the baseband and transmit signals (which are usually very small), the counters 246, 248 are small in comparison to the counters of FIG. 6. In contrast to the approach described above with reference to FIG. 6, the preferred approach measures offset errors when the signals of interest are at or near D.C. Therefore the counters used to implement the integrators 246, 248 can be relatively small. Consequently, when the present invention is implemented in an integrated circuit, the surface area necessary to occupy the correction circuit 222 is reduced. The associated manufacturing costs are also thereby reduced.

In addition, the preferred correction approach of FIG. 8 introduces much less noise and distortion into the feedback loop than does the approach of FIG. 6. In contrast to the correction circuit shown in FIG. 6, the correction circuit of FIG. 8 makes no assumptions about the D.C. characteristics of the baseband signals. The first approach of FIG. 6 assumes that the baseband signals contain no D.C. components whatsoever. In fact, the approach of FIG. 6 only indirectly analyzes the baseband signals. In contrast, the circuit of FIG. 8 makes no assumptions about the D.C. content of the input baseband signals and analyzes these signals directly. As a consequence, the approach of FIG. 8 more accurately tracks and filters the baseband signals. D.C. correction is applied only to the D.C. offsets introduced by the transmit DACs and the CDMA filters 104, 106. Advantageously, by using the approach of FIG. 8, D.C. correction is not applied to D.C. components present in the baseband signals if such components are present.

Once a correction is made to the baseband signals, the output of the D.C. correction circuit 222 of FIG. 8 remains relatively static until a new D.C. offset error is detected. In contrast, the circuit 222 of FIG. 6 is not static and will continuously attempt to converge around a correction point. Consequently, the D.C. offset correction circuit of FIG. 8 introduces much less noise and distortion into the system than does that of FIG. 6

A mathematical analysis of the D.C. offset loop of FIG. 5 (i.e., the feedback "loop" comprising the adders 228, 230, the transmit DACs 102, the CDMA filters 104, 106, the comparators 224, 226, and the D.C. offset correction circuit 222) is provided below to more fully describe the performance of the preferred and alternative embodiments of the present invention.

D.C. Offset Loop Analysis

The D.C. offset loop of FIG. 5 is highly non-linear due to the use of 1-bit comparators 224, 226 in the feedback path. Therefore certain loop characteristics (e.g., the loop time constant) are signal-dependent and consequentially difficult to quantify. The following analysis uses characteristics of CDMA signals to predict the loop time constant of the offset loop when used with the correction circuits of FIG. 6 and FIG. 8.

Figure 9:
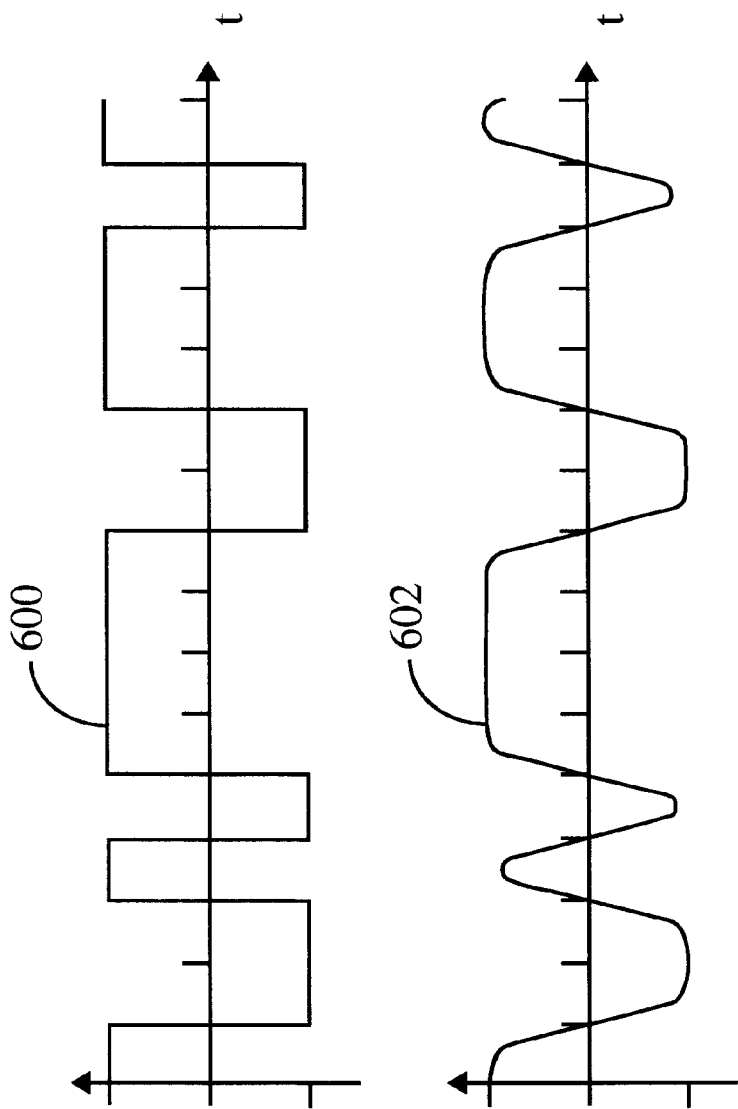
FIG. 9 shows a representation of an exemplary CDMA signal before and after filtering.

FIG. 9 shows a representation of an exemplary CDMA signal before filtering 600 and after filtering 602. As shown in the exemplary signal 600 of FIG. 9, the CDMA signals are essentially filtered random bit streams. This implies that the signal value will spend most of the time either large-positive or large-negative. The transition between the two (the zero crossing) provides the only opportunity for the D.C. offset loop to measure the D.C. offset introduced by the CDMA transmit filters 104, 106. To make analysis tractable, assume that the slope of the signal is constant as it passes through the zero crossing. This assumption is not exactly accurate, but it is a reasonable approximation. The slope at the zero crossing therefore can be calculated as follows:

If $V = A \cdot \cos(\omega \cdot t)$ then $\frac{dV}{dt} = -A \cdot \omega \cdot \sin(\omega \cdot t)$ and $\left|\frac{dV}{dt}\right|_{MAX} = A \cdot \omega_{MAX}$ Because the signal is a CDMA signal, it is band-limited to 630 kHz. Therefore $\omega_{MAX} = 2 \cdot \pi \cdot 630 \cdot 10^3$. To estimate the amplitude A, assume that the prefiltered signal is half scale (±64 Least Significant Bits (LSBs)) and toggles at a maximum rate of 630 kHz. Consequently, $A = (4/\pi) \cdot 64\ LSBs$. Therefore:

So $\left|\frac{dV}{dt}\right|_{MAX} = \frac{4}{\pi} \cdot 64 \cdot 2 \cdot \pi \cdot 630 \cdot 10^3$ $= 322.56\ LSBs\ \mu s$ $\cup 64\ LSBs/clk$ because the Tx Clock runs at approximately 5 MHz.

If a D.C. offset error is introduced by either the transmit DACs 102 or the CDMA filters 104, 106, the error will appear as added to the output transmit signal. The error will delay (or advance) the zero crossing. Assuming that the offset is small, this delay can be calculated as follows:

$$\Delta t = \Delta V \Big/ \left|\frac{dV}{dt}\right|_{MAX}$$

Where $\Delta V$ is the D.C. offset error in LSBs.

Figure 10:
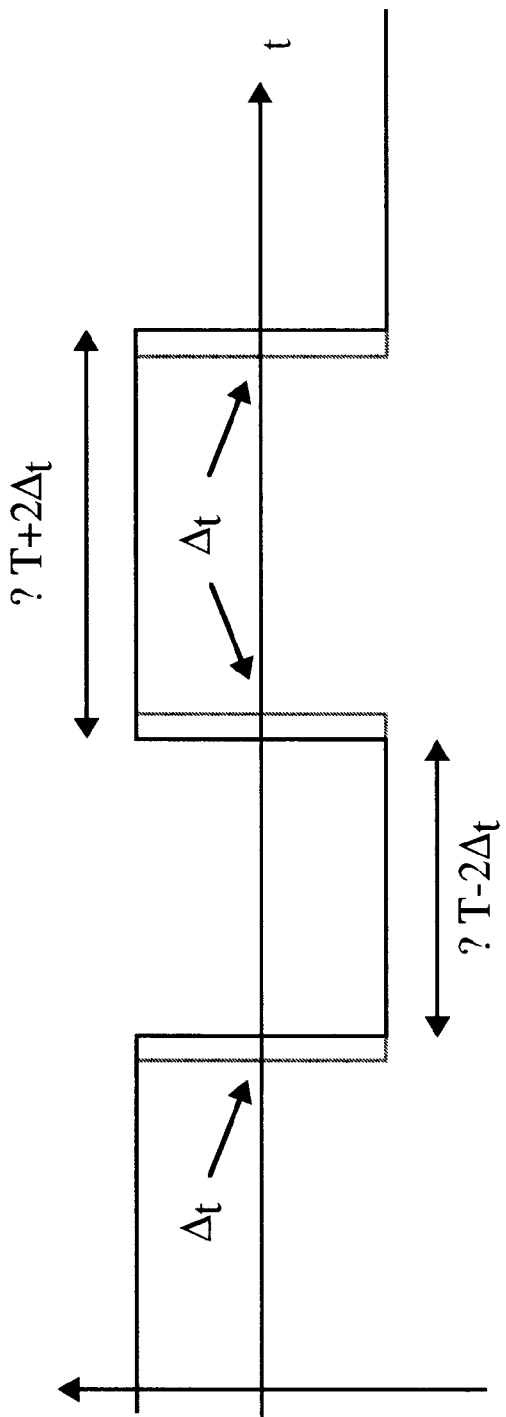
FIG. 10 shows an example of a digitized signal that is output by a comparator of FIG. 5 when a sign bit digital signal processing technique is used to correct the D.C. offset errors present in the signal.

This delay can now be examined in light of the two D.C. offset correction techniques described above with reference to FIGS. 6–8. FIG. 10 shows an example of a digitized signal that is output by a comparator (224 or 226, FIG. 5) when the sign bit digital signal processing technique described above is used to correct the D.C. offset error present in the signal. When the sign bit technique described above with reference to FIG. 6 is used, a positive D.C. offset causes the comparator output signal to remain a +1 for a longer time interval and −1 for a shorter time interval. As described above with reference to FIG. 6, the sign bit technique integrates the outputs of the comparators. Over one signal cycle (i.e., two zero crossings) the integrator counts down for a time interval equal to __T+2Δt, and it counts up for a time interval equal to __T−2Δt, where T is the period of the cycle. Thus the change in the output of the integrator can be calculated as follows:

$$\Delta I = -2^{-n} \cdot \frac{1}{2} \cdot T + 2 \cdot \Delta t \cdot \sqrt{} - \frac{1}{2} \cdot T - 2 \cdot \Delta t \cdot \sqrt{} \cdot ?\ LSBs/2\ ?ZC$$

$$= -2^{-n} \cdot \frac{2 \cdot \Delta V}{\left|\frac{dV}{dt}\right|_{MAX}} \cdot ?\ LSBs \Big/ ZC$$

The output of the integrator changes a value that is proportional to the D.C. offset error every two zero crossings ("ZC").

Figure 11:
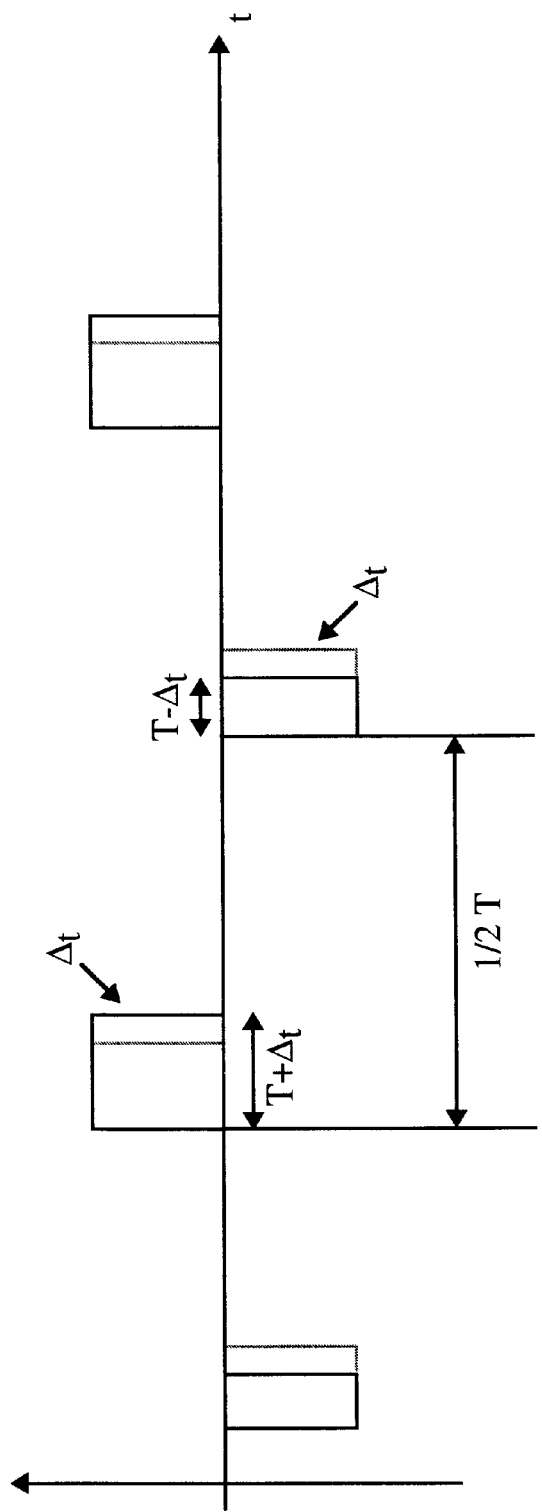
FIG. 11 shows an example of a digitized signal that is output by a comparator of FIG. 5 when an MSB digital signal processing technique is used to correct the D.C. offset errors present in the signal.

FIG. 11 shows an example of a digitized signal that is output by a comparator (224 or 226, FIG. 5) when the MSB digital signal processing technique described above is used to correct the D.C. offset error present in the signal. When the MSB technique described above with reference to FIGS. 7–8 is used, there is a factor of two difference because the integrator (e.g., the counter 246 of FIG. 8) only counts for one Δt per zero crossing rather than for two. In general:

$$\Delta I = -2^{-(n+USE\_MSB)} \cdot \frac{2 \cdot \Delta V}{\left|\frac{dV}{dt}\right|_{MAX}} \cdot ?\ LSBs \Big/ ZC;$$

where "USE_MSB" is 1 for the MSB technique and 0 for the sign bit technique.

The number of zero crossings per clock cycle can now be determined. In one preferred embodiment, the clock runs at a frequency of two times the Nyquist rate, or four times the "chip" rate when used in a CDMA communication system. CDMA signals comprise random data signals. Consequently, the probability of a zero crossing occurring between chips is __. Therefore, on average, a zero crossing occurs every two chips and thus every eight clock cycles. Consequently.

$$\Delta I = -2^{-(n+USE\_MSB)} \cdot \frac{2 \cdot \Delta V}{\left|\frac{dV}{dt}\right|_{MAX}} \cdot \frac{1}{8}\ LSBs/\text{clock}$$

$$= -2^{-(n+USE\_MSB)} \cdot \frac{\Delta V}{256} \cdot ?\ LSBs \Big/ \text{clock}$$

-continued $$= -2^{-(n+USE\_MSB+8)}?\Delta V?LSBs/\text{clock}$$

The feedback is negative and proportional to the D.C. offset error. Given that the change in the output of the integrator is the same as the change in the D.C. offset, it follows that:

$$\frac{d(\Delta V)}{dt} = -\alpha?\frac{\Delta V}{Tclk}; \text{ where } \alpha = 2^{-(n+USE\_MSB+8)}.$$

This is a first order differential equation which can be easily solved. The solution has the form:

$$\Delta V = A.e^{-t/\tau} + B$$

The item of interest from the above equation is the time constant τ. This is equal to Tclk/α. Therefore, the loop time constant of the offset loop can be expressed as follows:

$$\tau = 2^{(n+USE\_MSB+8)}?Tclk$$

Figure 1A:
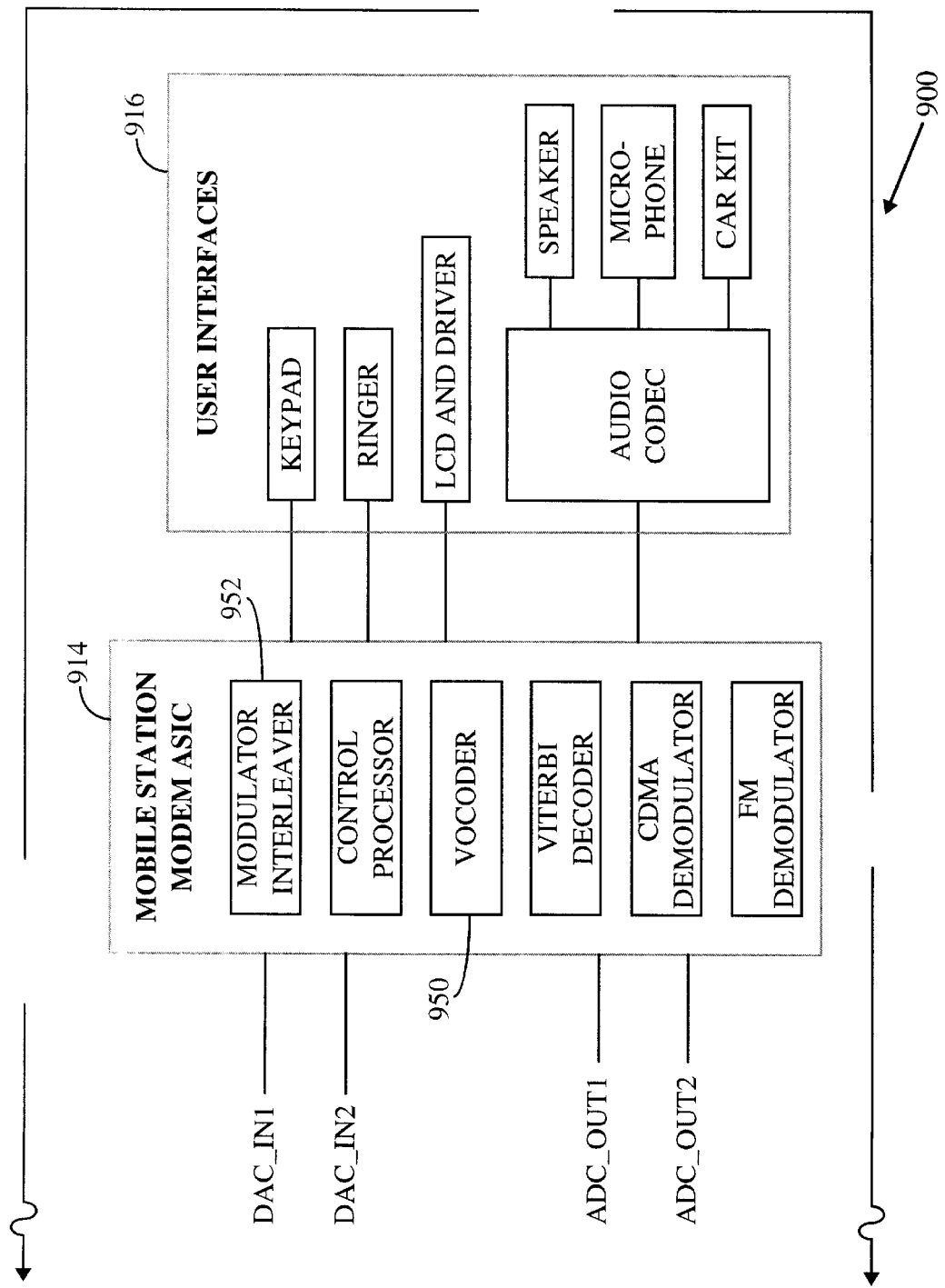
FIGS. 1a and 1b show a block diagram of an exemplary digital wireless cellular telephone utilizing digital-to-analog converters to convert digitally encoded voice signals into filtered baseband analog signals.
Figure 1B:
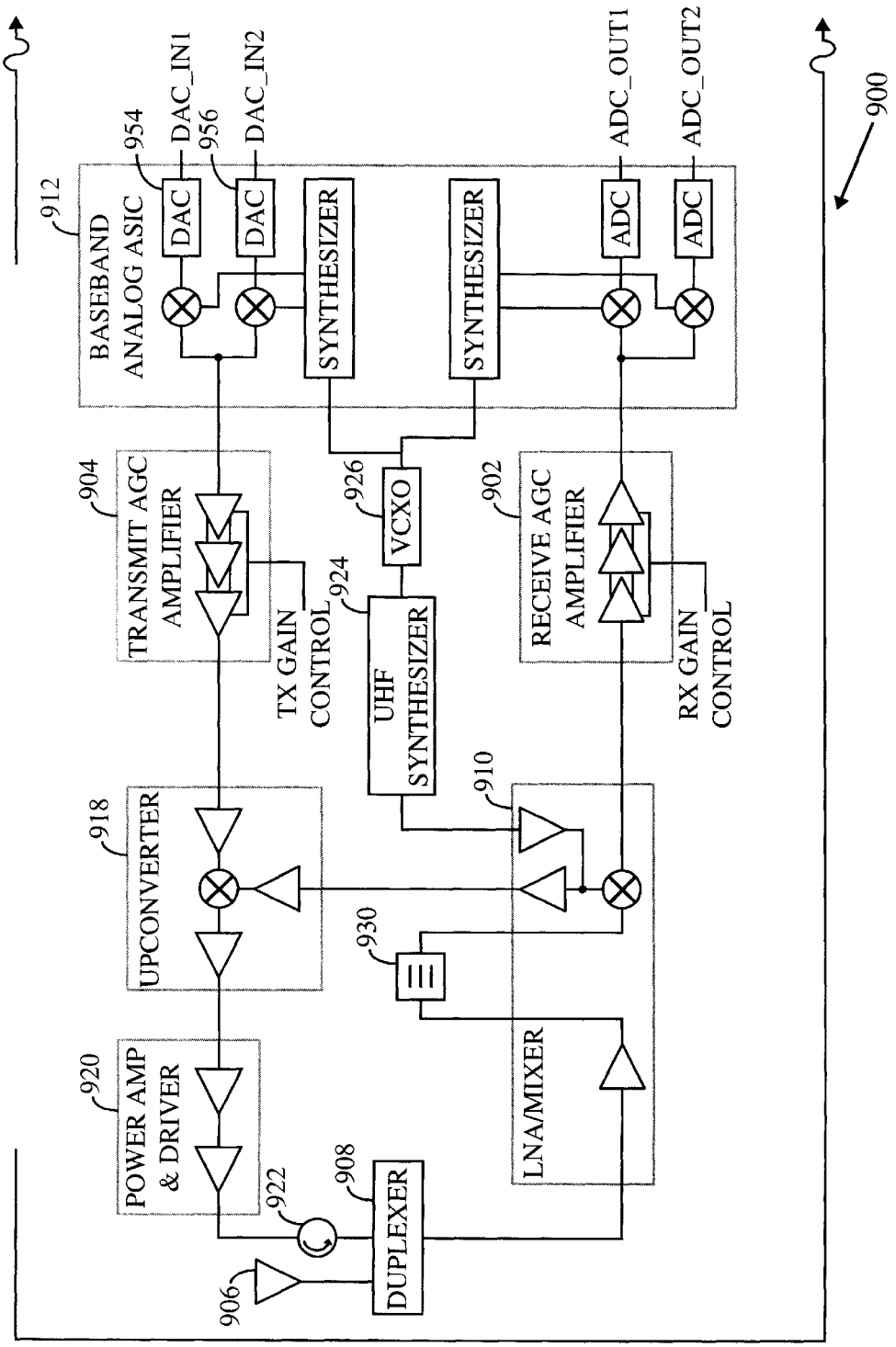

The apparatus of the present invention preferably is implemented in an ASIC that is used in a digital cellular telephone similar to that described above with reference to FIGS. 1a and 1b. Alternatively, the invention can be used in any device or system where it is desirable to remove D.C. offset errors that have been imposed upon a signal of interest. The D.C. offset correction method and apparatus of the present invention may be implemented in hardware (i.e., "hardwired"), or it may be implemented by software that is executed by a microprocessor or other data processing device in the mobile station. Alternatively, the method can be implemented using any convenient or desirable sequencing device such as a state machine, present state-next state discrete logic, or field programmable gate array device.

In summary, the invention includes a means for detecting, measuring, and correcting D.C. offset errors present in signals of interest. The present invention advantageously is easily implemented in an ASIC, does not require fuse trimming as did the prior art D.C. offset correction approaches, and dynamically and flexibly monitors and corrects D.C. offset errors as they are introduced into the signals of interest. The present invention is particularly useful in broadband wireless digital communication systems such as CDMA systems, however it also finds utility in PCS and other digital cellular communication systems.

A number of embodiments of the present invention have been described. Nevertheless, it will be understood that various modifications may be made without departing from the spirit and scope of the invention. For example, the means for converting the transmit signals that are output by the CDMA filters 104, 106 of FIG. 5 may, in alternative embodiments, comprise analog-to-digital converters having greater than 1-bit resolution. However, the value added to D.C. offset correction performance is probably not justified by the increase in complexity and cost that would be associated with using high resolution A/D converters. Therefore, as described above, the preferred A/D converter comprises a 1-bit comparator.

In addition, the means for digitally processing the converted transmit signals in the D.C. offset correction circuit 222 (FIGS. 6 and 8) may, in alternative embodiments, involve relatively complex digital signal processing techniques depending upon the desired convergence characteristics of the system. For example, more complex integrators can be used including a plurality of stages of integration. Similarly, in some alternative embodiments, the feedback signal (i.e., the transmit signal output by the CDMA filters) can be tapped at multiple stages of the CDMA filters. The CDMA filters 104, 106 comprise multi-stage active filters that can be tapped at one or more stages of the filter chain. Therefore, in an alternative embodiment of the present invention, the sign information is sampled by the D.C. correction circuit 222 at various points along the CDMA filter chain. Consequently, this alternative D.C. correction circuit includes an increased number of inputs corresponding to the increased number of sign information taps.

In another alternative embodiment, the counters 246, 248 of FIGS. 6 and 8 are clocked using at least two alternative clocking techniques to reduce potential bias problems that can occur when clocking the counters using the I-channel (ICLK) (or Q-channel (QCLK)) signal clocks. Over time, the clock signals (ICLK or QCLK) may become biased due to correlation between the digital baseband signals and the clock signal transitions. This bias can cause the counters 246, 248 to miscount and consequently incorrectly measure the time delays between zero crossings of the input baseband signals and their associated output transmit signals. Thus, in accordance with one alternative embodiment of the present invention, the counters 246, 248 are clocked by randomly swapping the I-channel and the Q-channel clocks. By randomly selecting the counter clock signal (using the value of the CDMA digital baseband signals), the clock signal is randomized, and the interval over which bias can occur is reduced by a factor of two.

Alternatively, each digital baseband signal channel is dithered using the opposite signal channel. Thus, the point at which the input digital baseband signals approach D.C. is randomized. In this alternative embodiment, some percentage of the I-channel baseband signal is added to the Q-channel baseband signal (e.g., in one embodiment, 10% of the I-channel baseband signal is added to the Q-channel baseband signal). Similarly, some percentage of the Q-channel baseband signal is added to the I-channel baseband signal (e.g., in one embodiment, 10% of the Q-channel baseband signal is added to the I-channel baseband signal). Using this alternative, the resulting transmit signals output by the CDMA filters will converge to zero even if the I-channel and Q-channel baseband signals include a D.C. offset error. In practice, neither of these alternative approaches are necessary because there appears to be sufficient randomness associated with the QCLK, ICLK clock transitions and their associated respective signal zero crossings to prevent the clock signals from exhibiting an undesirable bias with respect to the signal of interest.

Accordingly, it is to be understood that the invention is not to be limited by the specific illustrated embodiment, but only by the scope of the appended claims.

I claim:

1. A D.C. offset correction circuit for removing D.C. offset errors from baseband transmission signals in a communications device, the device receiving digital baseband input signals, wherein the input signals are converted to analog signal by transmit digital-to-analog converters, and wherein the analog signals are filtered by reconstruction filters to produce the baseband transmission signals, comprising:

a) an analog-to-digital (A/D) converter, comprising a 1-bit differential comparator disposed to convert the transmission signals to digital feedback signals by generating digitized representations of the signs of the transmission signals.

b) a D.C. offset correction digital signal processing block having at least one input operatively coupled to the A/D converter, wherein the offset correction block processes the digital feedback signals to produce D.C. offset correction signals nominally equal to the D.C. offset errors, said processing block comprising:

i) a decision block for generating an error signal responsive to the input signals and the transmission signals, wherein the error signal is indicative of the relative signs of the input signals and the transmission signals at any given time instance; and ii) integrator means for integrating the error signal; and c) an adder, operatively coupled to the offset correction block, the adder having a first input for receiving the input signals and a second input for receiving the offset correction signals, wherein the correction signals are added to the input signals thereby removing the D.C. offset errors from the transmission signals.

2. The D.C. offset correction circuit of claim 1, wherein the decision block comprises logic devices that implement the following truth table:

| Sign of the input signal | Sign of the transmission signal | Error signal output by the offset correction circuit |
|---|---|---|
| −1 | +1 | +1 |
| +1 | +1 | 0 |
| −1 | −1 | 0 |
| +1 | −1 | −1 | and wherein the error signal is provided as input to the integrator means.

3. The D.C. offset correction circuit of claim 2, wherein the integrator means comprises a binary up/down counter, and wherein the counter is incremented when the error signal is positive, and wherein the counter is decremented when the error signal is negative.

4. A D.C. offset correction circuit for removing D.C. offset errors from baseband transmission signals in a communications device, the device receiving digital baseband input signals, wherein the input signals are converted to analog signal by transmit digital-to-analog converters, and wherein the analog signals are filtered by reconstruction filters to produce the baseband transmission signals, comprising:

a) an analog-to-digital (A/D) converter, comprising a 1-bit differential comparator disposed to convert the transmission signals to digital feedback signals by generating digitized representations of the signs of the transmission signals;

b) a D.C. offset correction digital signal processing block having at least one input operatively coupled to the A/D converter, wherein the offset correction block processes the digital feedback signals to produce D.C. offset correction signals nominally equal to the D.C. offset errors;

c) an adder, operatively coupled to the offset correction block, the adder having a first input for receiving the input signals and a second input for receiving the offset correction signals, wherein the correction signals are added to the input signals thereby removing the D.C. offset errors from the transmission signals; and d) a processor capable of executing software instructions and having a zero-crossing time-delay counter, wherein the software instructions compare the signs of the input signals to the signs of the transmission signals at a given time instance, and wherein the processor increments, decrements, or does not affect the time-delay counter based upon the result of the comparison.

5. A D.C. offset correction circuit for removing D.C. offset errors from baseband transmission signals in a communications device, the device receiving digital baseband input signals, wherein the input signals are converted to analog signals by transmit D/A converters, and wherein the analog signals are filtered by reconstruction filters to produce the transmission signals, comprising:

a) conversion means for converting the transmission signals into digital feedback signals;

b) offset correction means, coupled to the conversion means, for digitally processing the digital feedback signals to produce D.C. offset correction signals nominally equal to the D.C. offset errors, the offset correction means comprising:

i) decision means for generating an error signal responsive to the input signals and the transmission signals, wherein the error signal is indicative of the relative signs of the input signals and the transmission signals at any given time instance; and ii) integrator means, coupled to the decision means, for integrating the error signal; and c) adder means, coupled to the offset correction means, the adder means having a first input for receiving the input signals and a second input for receiving the offset correction signals, wherein the correction signals are added to the input signals thereby removing the D.C. offset errors from the transmission signals.

6. A method for removing D.C. offset errors imposed upon transmission signals in a communications device that receives input signals, wherein the input signals are converted to analog signals and subsequently filtered within the device to produce the transmission signals, including the steps of:

a) converting the transmission signals into digital feedback signals;

b) processing the digital feedback signals to produce D.C. offset correction signals nominally equal to the D.C. offset errors, the processing step comprising the steps of:

i) receiving the most significant bits of the input signals;

ii) receiving the digital feedback signals;

iii) comparing the most significant bits of the input signals to the digital feedback signals; and iv) clocking a counter based upon the result of the comparison step; and c) adding the D.C. offset correction signals to the input signals thereby removing the D.C. offset errors from the transmission signals.

* * * * *